(12) United States Patent
Delaat et al.

(10) Patent No.: US 9,382,471 B2
(45) Date of Patent: Jul. 5, 2016

(54) SILICONE PRODUCT, A LIGHTING UNIT COMPRISING THE SILICONE PRODUCT AND METHOD OF MANUFACTURING A SILICONE PRODUCT

(71) Applicant: KONINKLIJKE PHILIPS N.V., Eindhoven (NL)

(72) Inventors: Antonius Wilhelmus Maria Delaat, Den Dungen (NL); Roelof Koole, Eindhoven (NL); Marcel Rene Bohmer, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/413,240

(22) PCT Filed: Jul. 10, 2013

(86) PCT No.: PCT/IB2013/055655
§ 371 (c)(1),
(2) Date: Jan. 7, 2015

(87) PCT Pub. No.: WO2014/009890
PCT Pub. Date: Jan. 16, 2014

(65) Prior Publication Data
US 2015/0152323 A1    Jun. 4, 2015

Related U.S. Application Data

(60) Provisional application No. 61/670,178, filed on Jul. 11, 2012.

(51) Int. Cl.
*H01J 1/62* (2006.01)
*C09K 11/02* (2006.01)
(Continued)

(52) U.S. Cl.
CPC .............. *C09K 11/025* (2013.01); *C08L 83/04* (2013.01); *F21V 9/16* (2013.01); *H01L 33/56* (2013.01); *B82Y 20/00* (2013.01); *B82Y 40/00* (2013.01); *Y10S 977/774* (2013.01); *Y10S 977/783* (2013.01); *Y10S 977/90* (2013.01); *Y10S 977/95* (2013.01)

(58) Field of Classification Search
CPC ................................. H01L 33/56; C08L 83/04
USPC .................................................. 313/503, 498
See application file for complete search history.

(56) References Cited

U.S. PATENT DOCUMENTS

| 6,819,049 B1 | 11/2004 | Bohmer | |
| 2003/0031438 A1* | 2/2003 | Kambe | B82Y 20/00 385/122 |

(Continued)

OTHER PUBLICATIONS

"Biphasic Route to Silica-Encapsulation of Quantum Dots" Riassetto et al, Nanoscience and Nanotechnology Letters, vol. 3, p. 655-658, 2011.

(Continued)

*Primary Examiner* — Vip Patel (57) ABSTRACT

A silicone product 100, a lighting unit comprising the silicone product and a method of manufacturing a silicone product are provided. The silicone product 100 comprises polymeric material 110, luminescent material 130 and filler particles 120. The polymeric material 110 comprises a material of the group of polysiloxanes. The polymeric material 110 being light transmitting. The luminescent material 130 comprises particles which have at least in one dimension a size in the nanometer range. The luminescent material 130 is configured to absorb light of a first spectral range and to convert a portion of the absorbed light into light of a second spectral range. The filler particles 120 are of a light transmitting inert material. The filler particles 120 are miscible with the luminescent material 130. The filler particles 120 are provided in the polymeric material 110. The particles of luminescent material 130 are distributed along a surface of the filler particles 120.

15 Claims, 4 Drawing Sheets

(51) Int. Cl.
*C08L 83/04* (2006.01)
*H01L 33/56* (2010.01)
*F21V 9/16* (2006.01)
*B82Y 20/00* (2011.01)
*B82Y 40/00* (2011.01)

(56) References Cited

U.S. PATENT DOCUMENTS

2006/0148986 A1* 7/2006 Glasgow ............... C08L 83/10
525/100

2011/0068321 A1 3/2011 Pickett et al.
2012/0045850 A1 2/2012 Aimiya et al.

OTHER PUBLICATIONS

Fabrication and Characterization of Transparent Zn0-Si02/Silicone Nanocomposites With Tunable Emission Colors Yang et al, Composites Part B 42 (2011) p. 2105-2110.

"Multiple Hydrophobic QDS Assembled in Si02 Particles Using Silane Coupling Agent" Yang et al, Colloids and Surfaces a. Physicochem. Eng. Aspects 397 (2012) p. 92-98.

* cited by examiner

SILICONE PRODUCT, A LIGHTING UNIT COMPRISING THE SILICONE PRODUCT AND METHOD OF MANUFACTURING A SILICONE PRODUCT

CROSS-REFERENCE TO PRIOR APPLICATIONS

This application is the U.S. National Phase application under 35 U.S.C. §371 of International Application No. PCT/IB2013/055655, filed on Jul. 10, 2013, which claims the benefit of U.S. Patent Application No. 61/670178, filed on Jul. 11, 2012. These applications are hereby incorporated by reference herein.

FIELD OF THE INVENTION

The invention relates to silicone products which comprise a luminescent material. The invention further relates to a lighting unit comprising the silicone product and a method of manufacturing a silicone product comprising immobilized luminescent materials

BACKGROUND OF THE INVENTION

In many lighting applications, especially in lighting application in which Light Emitting Diodes (LEDs) are used, silicone is used for optical elements, such as, for example, a lens or a light guide for guiding the light to a light exit window or improve the outcoupling of light from the LED. Silicones are sufficiently stable in LED application and are able to withstand the relatively high light dosages and high temperatures of LED applications. Such optical elements can easily be manufactured from a silicone resin.

Luminescent quantum dots are a promising material for creating lighting assemblies which emit a specific color of light, such as, for example, a lighting assembly which emits white light. The luminescent quantum dots absorb a portion of light emitted by, for example, a LED and convert the light towards light of another color. Quantum dots provide a high efficiency and relatively long lifetime if the quantum dots are well spatially separated in the matrix material. Because of the advantageous characteristics of silicone, the quantum dots are preferably embedded in silicone.

However, quantum dots and similar luminescent materials (such as quantum rods or quantum tetrapods) cannot be easily dispersed in silicone. It is known that quantum dots can easily be dispersed in liquids like toluene and some acrylic mixtures without forming clusters of quantum dots—in such liquids the quantum dots will be well spatially separated. Quantum dots are very small particles and during manufacturing they need to be added as a mixture of a solvent and quantum dots to a silicone resin. Quantum dots are not compatible with silicone resins and flocculation of the quantum dots occurs when they are mixed with a silicone resin. Other terms used for flocculation are aggregation, agglomeration and clustering. If quantum dots form agglomerates in which their mutual separation is less than a few nanometers (e.g. smaller than 7 nanometers), the quantum efficiency of the quantum dots reduces and a faster degradation upon irradiation is observed. Further, the quantum dots can still, to a limited extent, be mobile within the silicone resin and flocculation may slowly continue resulting in an even lower quantum efficiency. It is believed that the reduction of the quantum efficiency is the result of the occurrence of concentration quenching due to excitation and/or charge transfer between quantum dots. Further, undesired chemical reactions between neighboring quantum dots may also cause a degradation of the aggregates of quantum dots.

Published patent application US2012/0045850 discloses a material comprising quantum dots that is better compatible with many materials, such as water. The solution of the patent application may result in a material which is more compatible with silicone. The solution of the cited patent application is to create silica particles embedding the quantum dots. As silica particles are part of many silicone formulations the resulting silica coated quantum dots can easily be mixed into silicone resins.

In the approach in US2012/0045850 water is present in the reaction mixture preparing the silica nanoparticles. As for many quantum dots the presence of water either reduces the quantum efficiency directly and/or accelerates the degradation, the light conversion can be low or decreasing too rapidly over time. It seems that the use of, for example, water in the steps of creating the silica nanoparticles results in the creation non-light-emitting quantum dots. Thus, the quantum dots embedded in the silica nanoparticles of the cited patent show a relatively small light conversion efficiency and when the silica nanoparticles of the cited patent application are used in the silicone, the light conversion efficiency can be expected to be relatively low.

SUMMARY OF THE INVENTION

It is an object of the invention to provide a silicone product which comprises nanometer sized luminescent particles which have, in use, a relatively large quantum efficiency.

A first aspect of the invention provides a silicone product. A second aspect of the invention provides a lighting unit. A third aspect of the invention provides a method of manufacturing a silicone product comprising immobilized luminescent material. Advantageous embodiments are defined in the dependent claims.

A silicone product in accordance with the first aspect of the invention comprises polymeric material, luminescent material and filler particles. The polymeric material comprises a material of the group of polysiloxanes, the polymeric material being light transmitting. The luminescent material comprises particles which have at least in one dimension a size in the nanometer range. The luminescent material is configured to absorb light of a first spectral range and to convert a portion of the absorbed light into light of a second spectral range. The filler particles are of a light transmitting inert material. The filler particles are miscible with the luminescent material. The filler particles are provided in the polymeric material. The particles of luminescent material are distributed along a surface of the filler particles.

Another term often used for the polymeric material comprising a material of the group of polysiloxanes is silicone. Polysiloxanes are polymeric materials with the general formula $[R_2SiO]_m$ wherein R is an organic group, such as, for example, methyl, ethyl or phenyl. The backbone of the molecules is an inorganic Silicon-Oxygen chain . . . —Si—O—Si—O—Si—O— . . . .

The filler particles and the particles of the luminescent material are miscible, which means that the particles of the luminescent material and the filler particles both remain distributed in a solvent without being subject to extensive agglomeration, aggregation and/or flocculation. In practical embodiments it means that the filler particles and the particles of luminescent material can both be homogeneously mixed into at least one type of solvent. In a subsequent step, the colloidal stability of the luminescent particles is reduced causing them to flocculate. Due to the presence of the filler particles with excess surface area, the luminescent particles will flocculate onto the surface of the filler particles. Such a process in which one type of particles flocculates onto another type of particles is called heteroflocculation. Luminescent material and the filler particles do not have the tendency to stay away from each other in the solvent. When the luminescent material and the filler particles would be non-miscible, a non-homogeneous mix would be obtained in the solvent and, optionally, the luminescent material and/or the filler particles would flocculate.

The International Union of Pure and Applied Chemistry (IUPAC) distinguish different types of stability for colloidal system (a mixture of particles which are dispersed in a liquid medium). In this current invention it is assumed that the silicone product is colloidally stable. The definition of "colloidally stable" relates to the possibility to obtain a homogeneous solution in which as well as the luminescent material and the filler particles are solved and/or dispersed homogeneously. The filler particles and the luminescent material are both colloidally stable in a group of liquids. According to the IUPAC, colloidally stable means "the particles do not aggregate at a significant rate. An aggregate is, in general, a group of particles (which may be atoms or molecules) held together in any way. Aggregation is the process or the result of the formation of aggregates. When a colloidally system is colloidally unstable (i.e. the rate of aggregation is not negligible) the formation of aggregates is called coagulation or flocculation. These terms are often used interchangeably, but some authors prefer to introduce a distinction between coagulation, implying the formation of compact aggregates, leading to the macroscopic separation of a coagulum; and flocculation, implying the formation of a loose or open network which may or may not separate macroscopically. In many contexts the loose structure formed in this way is called a floc. The rate of aggregation is in general determined by the frequency of collisions and the probability of cohesion during collision. If the collisions are caused by Brownian motion, the process is called perikinetic aggregation; if by hydrodynamic motions (e.g. convection or sedimentation) one may speak of orthokinetic aggregation. In the context of this invention the distinction between "coagulation" or "flocculation" is not relevant. As soon as the luminescent material aggregates, the quantum efficiency decreases and this is prevented by the invention.

As a consequence of the invention, inside the polymeric material comprising the polysiloxane the luminescent particles are distributed along the surface of the filler particles. Thus, the tendency of the particles of the luminescent material to agglomerate, aggregate and/or flocculate inside the polymeric material comprising a polysiloxane is reduced, or even fully stopped, because the particles of the luminescent material are located at the surface of filler particles. In other words: within the polymeric material the luminescent particles are immobilized, because they are in contact with a filler particles, and they do not move anymore towards each other in the (cured) polymeric material, and, thus, they do not aggregate anymore. There is no tendency to form homoaggregates. Thus, most of the particles of the luminescent material do not touch other particles of the luminescent material, which means that they are well spatially separated from each other. As discussed before, a good spatial separation of the particles of luminescent material results in a relatively high quantum efficiency. Consequently, the silicone product exhibits, when being irradiated with light that is being absorbed and converted by the luminescent material, a relatively large color conversion efficiency.

The particles of the luminescent material have in at least one dimension a size in the nanometer range. This means, for example, that, if the particles are substantially spherical, their diameter is in the nanometer range. Or, this means, for example, if they are rod-shaped, that a size of a cross-section of the wire is in one direction in the nanometer range. A size in the nanometer range means that the size in the at least one dimension is at least smaller than 100 nanometers, thus, smaller than 0.1 micrometer, and larger or equal to 0.5 nanometer. In an embodiment, the size in one dimension is smaller than 50 nanometer. In another embodiment the size in one dimension is in the range from 2 to 20 nanometer. Most luminescent material with a size in the nanometer range in at least one dimension show quantum confinement, which means that the color of the light emitted by the material (as a consequence of absorbing light) strongly depend on their size. This applies to most quantum dots, however, specific quantum dots do not show quantum confinement. Also the quantum dots which do not show quantum confinement are subject to the same effects as the quantum dots discussed in the background of the art section (flocculation in silicone).

In an embodiment, it might be that the filler particles are not fully miscible with the (silicone) polymeric material such that the filler particles agglomerate, aggregate and/or flocculate up to some degree. However, the flocculation of the filler particles does not necessary negatively influence the efficiency of the particles of luminescent material. The particles of the luminescent material are distributed along the surface of the filler particles and, as such, when the filler particles touch each other, the particles of the luminescent material are still spatially separated from other particles of luminescent material by the filler particles.

Distributed along the surface of the filler particles means that the particles of the luminescent material are in contact with the surface of the filler particles and that at different portions of the surface luminescent particles may be found. Being in contact with each other does not directly imply that the luminescent particles and filler particles are fused or have a sort of binding as the result of a chemical reaction. The particles are still individual particles and can be identified separately. The particles are adjacent in the meaning of 'they have common border or endpoint', or they adjoin in the meaning of 'to lie next to each other or being in contact', and, thus, the particles are neighboring.

Further, in the context of this document, light transmitting means that light is transmitted through the material—in other words, if a light beam impinges on a surface of the material, at least some light is emitted at the same or other surfaces of the material. Thus, not all light is absorbed, for example, not more than 15% of the light is absorbed. In another embodiment, light transmitting means that not more than 10% of the light is absorbed. In yet a further embodiment, light transmitting means that not more than 10% of the light is absorbed. It is to be noted that transparent and translucent are terms falling within the scope of light transmitting. In the context of the invention, the filler particles are of a light transmitting material, but it is to be noted that the silicone product as a whole may absorb light, for example, the luminescent particles absorb light of a specific color and convert a portion of the absorbed light to light of another color.

Inert materials are materials which do not react with at least the materials which are used in the context of this invention under the circumstances described in the context of this document. Thus, the inert materials are not chemically reactive. This does not exclude that, under specific circumstances, the inert materials may be involved in a chemical reaction, but then large amounts of energy from heat, pressure or radiation are needed and often catalysts are used to assist the reactions.

Optionally, the filler particles are larger than the particles of luminescent material. If the filler particles are larger they have a relatively large surface compared to the size of the particles of luminescent material and, thus, when the particles of luminescent material are distributed along the surface of the filler particles, they are spatially well separated. Thus, the chance that particles of luminescent material are too close to each other such that their quantum efficiency drops is smaller. Further, within the polymeric material particles may move (as long as the polymeric material is not cured to a solid state), and larger particles move much slower than smaller particles. Thus, the smaller luminescent particles which are in contact with the larger filler particles move much slower through the polymeric material, and, thus they are better immobilized and do not aggregate. It is to be noted that the size of the filler particles may not become too large. Very large filler particles have a relatively small amount of surface area per gram of the material, and, thus, less space between particles of the luminescent material may be present between particles of the luminescent material which are in contact with the surface of a single filler particle. In an embodiment, the size of the filler particles is below 5 micrometer, or, in another embodiment, below 1 micrometer, or, in a further embodiment, below 500 nanometers. In yet another optional embodiment below 250 nanometers, and in a further optional embodiment smaller than 100 nanometers.

Optionally, the filler particles are not smaller than the particles of luminescent material.

Optionally, the luminescent material comprises at least one of quantum dots, quantum rods and quantum tetrapods. Thus, the particles which show quantum confinement and have at least in one dimension a size in the nanometer range are quantum dots, quantum rods or quantum tetrapods. The materials of this optional embodiment are incompatible with silicone resins, thus, with polymeric material comprising polysiloxane.

Optionally, at least 60% of the particles of the luminescent material are separated far enough from other particles of the luminescent material to prevent a reduction of quantum efficiency of these particles. In an embodiment at least 75% of the particles of the luminescent material are separated far enough from each other. In another embodiment, at least 90% of the particles of the luminescent material are separated far enough from each other. Separated far enough from each other means that these particles at least do not touch each other, and may mean in an optional embodiment that concentration quenching does not occur. Further, it was observed that when the luminescent particles are located very close to each other, for example, at 7 nanometers distance, the quantum efficiency drops. The effect of this optional embodiment is that the quantum efficiency, and thus the color conversion efficiency, of the silicone product as a whole is relatively high. In an embodiment, the particles of the luminescent material that are separated far enough from each other have at least a distance of 10 nanometers between the particles without another particles of the luminescent material in between them.

Optionally, the filler particles are silica particles or the filler particles comprise a material of one of the groups of alumina, titania, silica materials or a clay. Silica particles are often used in polymeric materials which comprise polysiloxane and can easily be mixed with such polymeric materials. In general, silica particles have a refractive index which is close to the refractive index of polymeric materials which comprise polysiloxane and, thus, light is not much refracted at the interfaces between the silica particles and the polysiloxane material and not much light is reflected a these interfaces. Thus, the silicone product remains relatively transparent and does not much scatter light. In other embodiments, scattering of light is required, and materials used for the filler particles have a refractive index that differs more from the refractive index of the polymeric material comprising polysiloxane. Transparent particles of clay have often a relatively flat shape which results in a relatively large outer surface along which the particles of luminescent materials can be distributed, and, thus, a good spatial separation of the particles of luminescent materials is obtained.

Optionally, the particles of the luminescent material comprise a first layer of organic material at their surface. Optionally, the filler particles comprise a second layer of organic material at their surface. The first layer and/or the second layer are applied to, respectively, the particles of luminescent material and/or the filler particles to make them miscible in the solvents used in preparation processes. Optionally, at least one of the first layer and the second layer of organic material is a monolayer of the organic material. A monolayer is the amount of organic material needed to form a densely packed, one molecule thick layer. Especially when the first layer and/or the second layer are similar organic layers, the filler particles and the particles of luminescent material are better miscible with each other in a solvent and, thus, the particles of luminescent material can be processed to be better spatially separated along the surface of the filler particles—in other words, the particles of luminescent material do not tend to flocculate or agglomerate.

Optionally, not more than 20% of the surface of the filler particles is covered by particles of the luminescent material. When less than 20% of the surface of the filler particles is covered by the particles of luminescent material, the particles of luminescent material are probably well spatially separated. It may be tested whether the silicone product fulfills the condition of this optional embodiment by making Transmission Electron Microscopy (TEM) images of the silicone product, determining the size of the filler particles and calculating its corresponding surface area, determining the number of particles of luminescent material at the surface of the filler particles, determining the size of the particles of luminescent material, calculating the surface of the filler particles covered by the luminescent particles, and calculating the relative amount of the surface of the filler particles covered by the luminescent particles. It is to be noted that the relative amount of the surface of the filler particles covered by the particles of luminescent material is an average number and that the surface of individual filler particles may be covered by a higher percentage. In another optional embodiment not more than 10% of the surface of the filler particles is covered by particles of the luminescent material. In a further optional embodiment not more than 5% of the surface of the filler particles is covered by particles of the luminescent material.

Optionally, the relative amount of luminescent material is at least 0.05 weight percent of the silicone product and the relative amount of the luminescent material is not more than 10 weight percent of the silicone product. Such a relative amount of particles of the luminescent material is in general enough to provide the required light conversion by these luminescent particles (which, of course, also depends on the configuration of the light emitting device). Further, in the invention, if the relative amount is below 10 wt %, the particles of luminescent material can be advantageously distributed along the surface of the filler particles without being in contact with other particles of the luminescent material.

Optionally, the relative amount of the filler particles is not more than 40 weight percent of the silicone product, and the relative amount of the filler particles is at least twice the relative amount of luminescent material expressed as a weight percentage of the silicone product. In practical embodiments, the amount of filler particles should be below 40 wt % in order to maintain advantageous properties of the polymeric material which comprises a polysiloxane.

Optionally, the largest size of the filler particles is smaller than 5 micrometer. In another optional embodiment, the largest size of the filler particles is smaller than 1 micrometer. In a further optional embodiment, the largest size of the filler particles is smaller than 500 nanometers. Largest size means in the context of this document: a cross-sectional size of the filler particle in a specific direction and in all other directions the cross-sectional size is smaller than the largest size. Thus, if the filler particles are substantially spherical, the diameter of the particles is less than 500 nanometers. If the filler particles have a rod-shape, the length of the rod is less than 500 nanometers. If the filler particles are flat shapes, any line that can be drawn in the flat plane is shorter than 500 nanometers.

Optionally, the polymeric material has a first refractive index and the filler particles have a second refractive index. The largest size of the filler particles is smaller than 100 nanometers if the absolute difference between the first refractive index and the second refractive index is larger than 0.3. The larger the difference in refractive indices between the two types of material the more reflection and refraction occurs at the interfaces between the two materials, which results in a diffusion of the light which transmits through the silicone product. In specific embodiments this is undesired and it is required that the silicone product is substantially transparent. This can be obtained by using materials of about the same refractive index, which means that the difference in refractive indices is less than 0.1, or which can be obtained by reducing the size of the filler particles in dependence of the difference in refractive indices. The numbers provided in this optional embodiment result in a silicone product which diffuses/scatters light only up to a limited extent. It is further to be noticed that transparency does not necessary only dependent on the differences in refractive indices. It also depends on the particles size and the particle volume fraction. If the silicone product is, for example, applied in a thin layer of, for example, 1 micrometer, a layer can still be transparent when 20 nanometer $TiO_2$ are present in the layer. Further, the relative amount of filler particles also contributes to the amount of transparency.

Optionally, the silicone product is a resin and the silicone is a silicone resin. When the silicone product is a resin it is, up to some extent, flexible/liquid and can be formed into different shapes. With specific treatments the resin may be cured such that a solid silicone product is obtained.

According to a second aspect of the invention, a lighting unit is provided which comprises a light source and a silicone product according to the first aspect of the invention. The silicone product is arranged to receive light from the light source.

The lighting unit according to the second aspect of the invention provides the same benefits as the silicone product according to the first aspect of the invention and has similar embodiments with similar effects as the corresponding embodiments of the silicone product.

According to a third aspect of the invention, a method of manufacturing a silicone product comprising immobilized luminescent material is provided. The method comprises the steps of: i) obtaining a mixture of filler particles of a light transmitting inert material and luminescent material comprising particles showing quantum confinement and having at least in one dimension a size in the nanometer range, wherein the particles of the luminescent material are situated at a surface of the filler particles; ii) mixing the mixture with a polymeric material comprising a material of the group of polysiloxanes.

The method according to the third aspect of the invention provides the same benefits as the silicone product according to the first aspect of the invention and has similar embodiments with similar effects as the corresponding embodiments of the silicone product.

Optionally, the step of obtaining a mixture comprises the sub steps of: a) obtaining a first homogeneous mixture of the filler particles in a first solvent, b) obtaining a second homogeneous mixture of the luminescent material in a second solvent, c) mixing the first homogenous mixture with the second homogeneous mixture to obtain a third homogeneous mixture, and d) flocculating the luminescent material on the filler particles by changing the solvent composition of the third homogeneous mixture or by changing the solvent quality of the third homogeneous mixture.

The method to obtain the mixture starts with obtaining the first homogeneous mixture and the second homogeneous mixture. These mixtures may be obtained directly from a manufacturer of such homogeneous mixtures, or may be prepared by, for example, diluting a stock solution in the same solvent as the solvent of the stock solution. Subsequently these homogeneous mixtures are mixed to obtain a third homogeneous mixture. The third homogeneous mixtures can only be obtained if the first solvent and the second solvent do not cause an aggregation or flocculation of the luminescent material and the filler particles. Subsequently, in the step of flocculating the luminescent material on the filler particles, a third solvent or additive is added to the third homogeneous mixture which causes a change of the solvent composition of the third homogeneous mixture such that the luminescent material flocculates to the surface of the filler particles and the combination of the filler particles with luminescent material flocculates. Alternatively, the quality of the solvent composition of the third homogeneous mixture is changed by, for example, changing the temperature of the solvent composition, such that the luminescent material flocculates on the filler particles. Often the term heteroflocculation is used for this process. Subsequently, in an optional embodiment, the solvents (the first solvent and/or the second solvent) are removed. This may be done, for example, by evaporating the solvents. Alternatively, the solvents are removed after mixing the obtained mixture of filler particles and the luminescent material with the polymeric material.

The method of obtaining the mixture of the filler particles and the luminescent material is an effective and an efficient way of obtaining the silicone product of the invention. It was seen that the particles of the luminescent material are well distributed along the surface of the filler particles and that most of the particles of the luminescent material are not located too close to each other.

It is to be noted that the first solvent and the second solvent may be the same solvent.

These and other aspects of the invention are apparent from and will be elucidated with reference to the embodiments described hereinafter.

It will be appreciated by those skilled in the art that two or more of the above-mentioned options, implementations, and/or aspects of the invention may be combined in any way deemed useful.

Modifications and variations of the product and/or the method, which correspond to the described modifications and variations of the product, can be carried out by a person skilled in the art on the basis of the present description.

It should be noted that items denoted by the same reference numerals in different Figures have the same structural features and the same functions. Where the function and/or structure of such an item have been explained, there is no necessity for repeated explanation thereof in the detailed description.

The Figures are purely diagrammatic and not drawn to scale. Particularly for clarity, some dimensions are exaggerated strongly.

DETAILED DESCRIPTION

Figure 1:
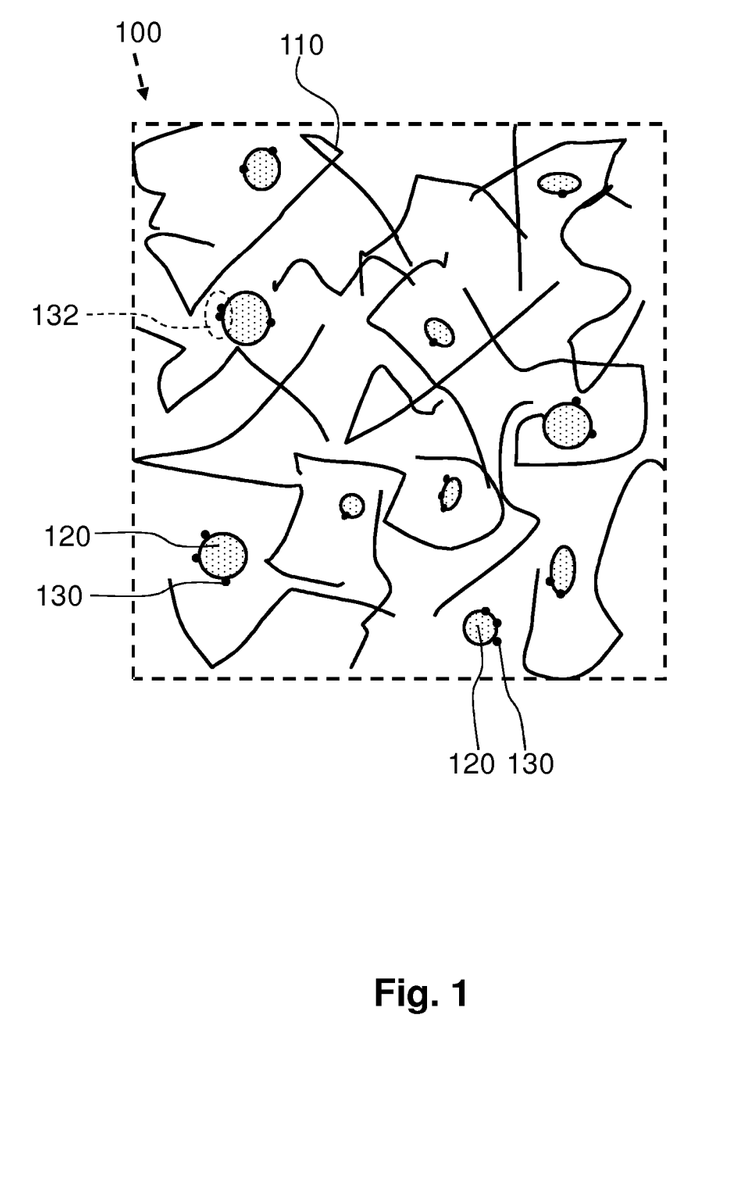
FIG. 1 schematically shows an embodiment of the silicone product.

A first embodiment is shown in FIG. 1. FIG. 1 schematically shows, in a cross-sectional view, an embodiment of the silicone product 100. The schematic presentation of FIG. 1 is an enlargement and with a dashed line a virtual border of the product 100 is drawn—however, in practical embodiments, the shown enlargement is only a fraction of a much larger quantity of the silicone product 100. Further, the presented silicone product 100 may be a solid material, or may be a resin which comprises other molecules (not shown) for creating the semi-fluid state of the material (such materials are, for example, monomers, macromonomers, oligomers or reactive compounds).

The silicone product 100 comprises polymer molecules 110 of the group of polysiloxanes. Often the term silicone is used instead of a material of the group of polysiloxanes. Polysiloxanes are a polymeric material with the general formula $[R1R1SiO]_m$ wherein R1 and R2 are an organic group, such as, for example, methyl, ethyl or phenyl. R1 may be equal to R2. The backbone of the molecules is an inorganic Silicon-Oxygen chain . . . —Si—O—Si—O—Si—O— . . . . In FIG. 1 the polymer molecules 110 are drawn as irregular lines which represent the Silicon-Oxygen chain. The material formed by the polymer molecules 110 is light transmitting, which means that light can be transmitted through the material—in other words, not much light is absorbed by the material, for example, not more than 15% of the light is absorbed. In another embodiment, light transmitting means not more than 10% of the light is absorbed. It is to be noted that the material may be clear (transparent) or may be diffuse light transmitting (translucent).

The silicone product 100 further comprises filler particles 120. The filler particles are light transmitting. Thus, when only filler particles 120 would be provided in the material of polysiloxane molecules 110, the combination of them would still be light transmitting. It is to be noted that the filler particles may influence optical characteristics of the material. For example, if a difference between the refractive index of the filler particles and the refractive index of the material of polysiloxane molecules 110 is relatively large and if the size of the filler particles is comparable to the wavelength of (visible) light or larger, the filler particles partially reflect light which impinges on them and partially transmit and refract light—this results in a more diffuse/translucent silicone product 100.

The filler particles 120 are of an inert material. In the context of this document inert materials are materials which do not react with at least the materials which are used in the context of this document under the circumstances described in the context of this document. Thus, the inert materials are not chemically reactive. This does not exclude that under specific circumstances the inert materials may be involved in a chemical reaction, but in such situations, large amounts of energy from heat, pressure or radiation are needed and often catalysts are used to assist reactions which the inert materials. Thus, the material of the filler particles 120 does not react with the polysiloxane molecules 110, with materials added to the polysiloxane molecule 110 to create a resin, etc. under normal atmospheric conditions, during use in a lighting assembly, and/or in combination with later discussed materials (such as luminescent materials). As will be discussed later, the filler particles 120 may have a layer of an organic material at their surface. In certain circumstances, this layer may be reactive with the polymer molecule 110 when the silicone product 110 is cured.

An advantageous material for the filler particles is silica. Silica ($SiO_2$) is often used within a material which comprises a polysiloxane and in many optical applications the amount of silica used in a silicone may peak at 30 or even at 40 weight percent (wt %) of the total weight of the silicone resin. Other suitable materials from which transparent inert particles can be manufactured are materials from the groups of alumina, titania, silica or, for example, a clay. Specific types of transparent clays can be used and, in general, these particles have a relatively flat shape and thus a relatively large outer surface along which the luminescent particles 130 may be distributed. Flat shaped particles provide an advantageous spatially separation of the luminescent particles 130.

The silicone product 100 further comprises luminescent material which comprises luminescent particles 130 of a material which shows quantum confinement and has at least in one dimension a size in the nanometer range. Quantum confinement means that the particles have optical properties that depend on the size of the particles. The luminescent particles 130 are configured to absorb a portion of light which impinges on them and to convert a portion of the absorbed light into light of another color. The luminescent particles 130 of the luminescent material have in at least one dimension a size which is in the nanometer range. This means, for example, that, if the particles 130 are substantially spherical, their diameter is in the nanometer range. Or, this means, for example, if they are rod-shaped, that a size of a cross-section of the rod is in one direction in the nanometer range. A size in the nanometer range means that their size is at least smaller than 100 nanometers, thus, smaller than 0.1 micrometer, and larger or equal to 0.5 nanometers. In an embodiment, the size in one dimension is smaller than 50 nanometers. In another embodiment, the size in one dimension is in the range from 2 to 20 nanometers. Examples of suitable luminescent particles 130 are quantum dots, quantum rods and quantum tetrapods. In another embodiment, the luminescent particles 130 do not show quantum confinement. For example, Mn-doped ZnSe quantum dots show a light emission of the Mn-ions and, thus, is the light emission of these quantum dots independent of the size of the quantum dots.

Quantum dots are small crystals of semiconducting material generally have a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with shell such as cadmium sulfide (CdS) and zinc sulfide (ZnS). Cadmium free quantum dots such as indium phosphode (InP), and copper indium sulfide (CuInS2) and/or silver indium sulfide (AgInS2) can also be used. Quantum dots show very narrow emission band (for example, with a width of 50 nanometer, or even 25 nanometer, expressed as a Full Width Half Maximum (FWHM) value) and, thus, they show saturated colors. Furthermore the color of the light can easily be tuned by adapting the size of the quantum dots. Any type of quantum dot known in the art may be used in the present invention. Other examples of materials of which quantum dots are made are: ZnSe, Silicon, CuInS, Carbon, ZnO, and Mn-doped materials. Other types of nanosized luminescent materials are silver clusters, or other magic-sized noble metal clusters.

Quantum rods typically consist of a CdSe quantum dot core, surrounded by a rod-shaped CdS shell, which can have aspect ratios of 2 to 20. This could also be an InP quantum dot core, surrounded by a rod-shaped shell of similar dimensions. In another case the rod comprises CdSe or InP rod-shaped nanocrystal, surrounded by a few monolayers of inorganic shell materials like CdS or ZnS. A tetrapod comprises a core of, for example, CdSe or InP, surrounded by a shell of material that preferably grows on certain facets of the nanocrystal such that a nanocrystal with a tetrapod-shape results. Finally, the recently reported nanoplatelets (Ithurria et al, Nature Materials 2011) are also included as luminescent nanomaterials. These materials are platelets of only a few (2-20) monolayers of eg CdSe or InP, and have much larger dimensions in the other two direction. Quantum confinement hence takes place in only one direction.

The luminescent particles 130 and the filler particles 120 are well miscible with each other. This means that they do not show the tendency to go away from each other when they are, for example dissolved in a medium/liquid in which they are able to move freely. In a subsequent step, the luminescent particles are brought to flocculate. In this process they heteroflocculate onto the surface of the filler particles and they will stay there. Thus, when the luminescent particles 130 are brought in contact with filler particles 120, they remain in contact with the filler particles. When the luminescent particles 130 are in a non-compatible fluid or resin, they show the tendency to agglomerate, aggregate and/or flocculate, however, when they are on the surface of a filler material, they remain mainly at their position. Often the term "chemical affinity" is used to describe the well-miscibility of two materials. In practical embodiments, it means that the filler particles 120 and the luminescent particles 130 can both be homogeneously mixed into at least one type of solvent. In other practical embodiment, the particles 120, 130 are both compatible with more than one solvent.

In the silicone product 100 the luminescent particles 130 are distributed along the outer surfaces of the filler particles 120. This means that the luminescent particles 130 touch a filler particle 120. Both materials remain in contact with each other in the silicone product 100. Due to this the luminescent particles remain homogenously distributed in the silicone product. In general, luminescent particles 130, which show quantum confinement and have one dimension in the nanometer range, are not well miscible with a material which comprises polysiloxane molecules 110. Especially this results in the fact that the luminescent particles 130 remain in the silicone product 100 in contact with the filler particles 120. When the luminescent particles 130 are in contact with filler particles 120 they do not have any more the tendency to flocculate or agglomerate and thus remain spatially separated. When the luminescent particles 130 are well spatially separated, they provide an advantageous color conversion efficiency—hence, their quantum efficiency is relatively high. It is to be noted that in another embodiment, the filler particles may be porous and that the luminescent particles are not only present at the 'outer' surface of the filler particles, but also at the 'inner' surfaces of the filler particles.

In an embodiment, at least 60% of the luminescent particles 130 are separated far enough from other luminescent particles 130 to prevent a reduction of quantum efficiency of these particles. In an embodiment at least 75% of the luminescent particles 130 are separated far enough from other luminescent particles 130. In yet another embodiment, at least 90% of the luminescent particles 130 are separated far enough from other luminescent particles 130 Separated far enough from each other means that these particles at least do not touch each other and they are spaces apart at a distance which prevents concentration quenching. The effect of these embodiments is that the quantum efficiency, and thus the color conversion efficiency, of the silicone product 100 as a whole is relatively high. In an embodiment, the luminescent particles 130 that are separated far enough from other luminescent particles 130 have at least a distance of 7 nanometers between the each other without another luminescent particles 130 in between them. However, in some situations, as shown in FIG. 1 at location 132, still some luminescent particles may be in contact with each other or within a distance of 7 nanometers from each other.

As drawn in FIG. 1, in an embodiment, the filler particles 120 are larger than the luminescent particles 130. However, the size of the filler particles 120 may be equal to the size of the luminescent particles 130. If the filler particles 120 are larger than the luminescent particles 130 the luminescent particles 130 will be better spatially separated by the filler particles.

The relative amount of filler particles 120 within the silicone product is below 40 wt %, and in another embodiment, below 30 wt %. The relative amount of luminescent particles 130 mainly depends on the light conversion requirements. In an embodiment, their relative amount is between 0.1 wt % and 10 wt %. In another practical embodiment, their relative amount is between 0.5 wt % and 5 wt %. To obtain an advantageous spatially separation of the luminescent particles 130 in the silicone product 100, the relative amount of filler particles 120 is larger than the relative amount of luminescent particles 130 (when being expressed in a weight percentage). An even better spatially separation of the luminescent particles 130 is obtained in the silicone product 100 if the relative amount of filler particles 120 is 10 wt % larger than the relative amount of luminescent particles 130.

It is to be noted that in FIG. 1 the cross-sectional shapes of the filler particles 120 and the luminescent particles 130 is circular or elliptical. The drawn shapes are purely schematic and the filler particles 120 and the luminescent particles 130 may have completely different shapes.

Figure 2:
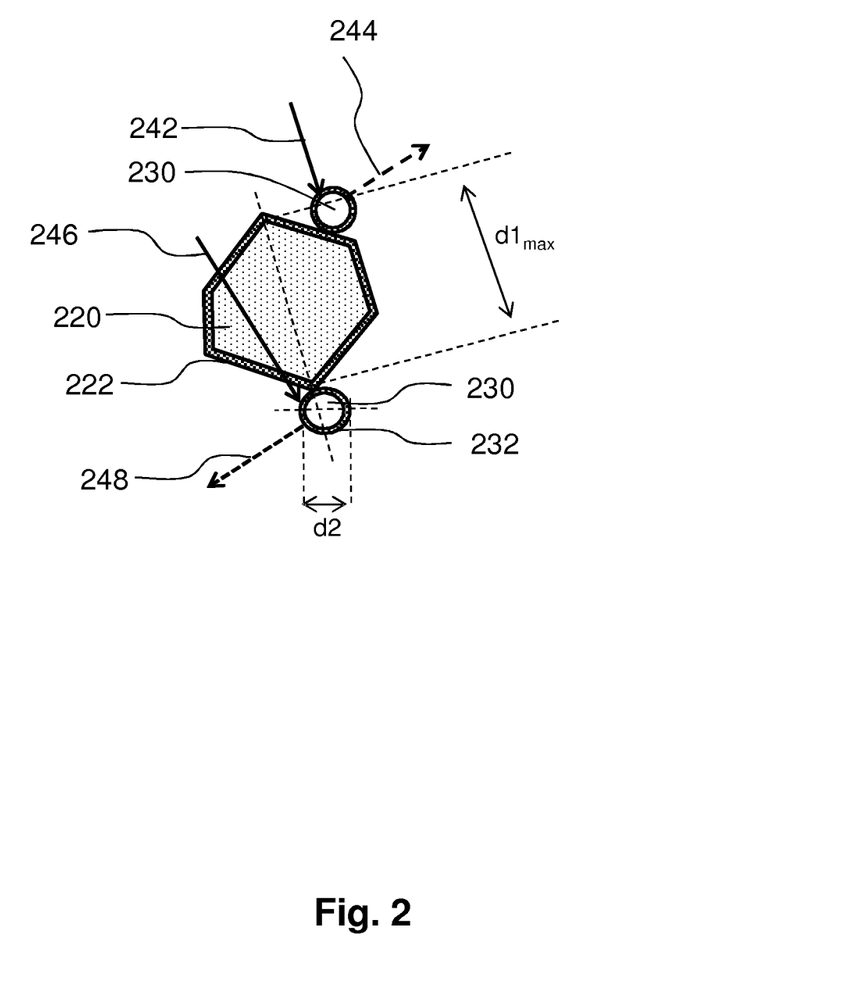
FIG. 2 schematically shows an embodiment of a filler particle with two particles of a luminescent material being in contact with a surface of the filler particle, FIG. 3 schematically shows a lighting unit according to the second aspect of the invention, and FIG. 4 schematically presents an embodiment of a method of manufacturing a silicone product.

Optionally not more than 20%, or not more than 10% of the surface of the filler particles 230 is covered by particles 130 of the luminescent material. To determine the relative amount of the surface of the filler particles 230 being covered by the particles 130 of the luminescent material, it is reasonable to assume that the filler particles are spherical and non-porous. Further, based on TEM imaging, one may determine for a sample of the silicone product an average size of the filler particles, an average size of the particles of luminescent material and an average number of particles of luminescent material being in contact with the filler particles. Based on these numbers one may determine how large the average surface of an average spherical filler particle is. Further, the area covered by a single particle of the luminescent material is a projection of the surface area of the single particle of the luminescent material on the surface of the filler particle. For example: if the average diameter of a silica filler particles is, for example, 100 nm, the average surface area of such particles is $1 \cdot 10^{-14}$ m². If the average diameter of the of quantum dots particles is, for example, 7 nm, the area of the surface of the silica filler particles is $4 \cdot 10^{-17}$ m². When the average amount of quantum dots on a single silica filler particle is 10, the average area coverage is 0.04=4%.

FIG. 2 schematically shows an embodiment of a filler particle 220 with two particles 230 of a luminescent material being in contact with a surface of the filler particle 220. The silicone product 100 of FIG. 1 may comprise a multitude of such filler particles 220 and luminescent particles 230. The drawing of FIG. 2 presents a cross-sectional view of the filler particle 220 and the luminescent particles 230. The filler particle 220 has in a cross-sectional view a shape similar to a hexagon, and in other embodiments, the cross-sectional shape may be different. The surface of the filler particle 220 comprises a first layer 222 of an organic material. The first layer 222 may be a monolayer, which means that it is a layer which is only one molecule thick. The luminescent particles 230 are in contact with the filler particle 220, which means that the luminescent particles 230 are distributed along the surface of the filler particle 220. The surface of the luminescent particles 230 comprises a second organic layer 232. In an embodiment, the second organic layer 232 is a monolayer.

In FIG. 2 light 242 is schematically drawn by means of an arrow. Light 242 impinges on one of the luminescent particles 230 and is at least partially absorbed by the respective luminescent particles 230. The respective luminescent particle converts the absorbed light towards light 244 of another wavelength. The another luminescent particle 230 receives light 246 and the another luminescent particle 230 may be arranged to convert the absorbed light to yet another wavelength 248. It is noted that in the context of the invention different luminescent particles 230 may be used. They may be differently with respect to the color of light which is being emitted and this color strongly depends on the size of the particle 230. All luminescent particles 230 show quantum confinement and have a size in a specific dimension which is in the nanometer range.

In FIG. 2 a size of the luminescent particle 230 is indicated by d2. In a cross-sectional view, a width of the luminescent particle 230 is in the nanometer range, which means that the width is in the range from 1 to 100 nanometers. The cross-sectional view of FIG. 2 may be a cross-section of a spherical luminescent particle, or the cross-section of, for example, a wire shaped particle. Other cross-sectional shapes are also possible. In FIG. 2 also a maximum size of the filler particle 220 is indicated by $d1_{max}$. Maximum size means that no other line which intersects the filler particle 220 intersects the particle along a longer length than the maximum size. In an embodiment, the size of the filler particles is below 5 micrometer, or, in another embodiment, below 1 micrometer, or, in a further embodiment, below 500 nanometers. In yet another optional embodiment below 250 nanometers, and in a further optional embodiment smaller than 100 nanometers. When the filler particles have a smaller size, the total area of the filler particles surface is larger and, thus, the particles of luminescent material are distributed along a relatively larger surface which increases the probability that the particles of luminescent material are better spatially separated. The smaller the filler particles are, the larger their surface area expressed as m²/gram. However, it is advantageous if the filler particles are at least two or three times larger than the particles of luminescent material to obtain a good spatial separation of particles of luminescent material which are in contact with a single filler particle.

Figure 3:
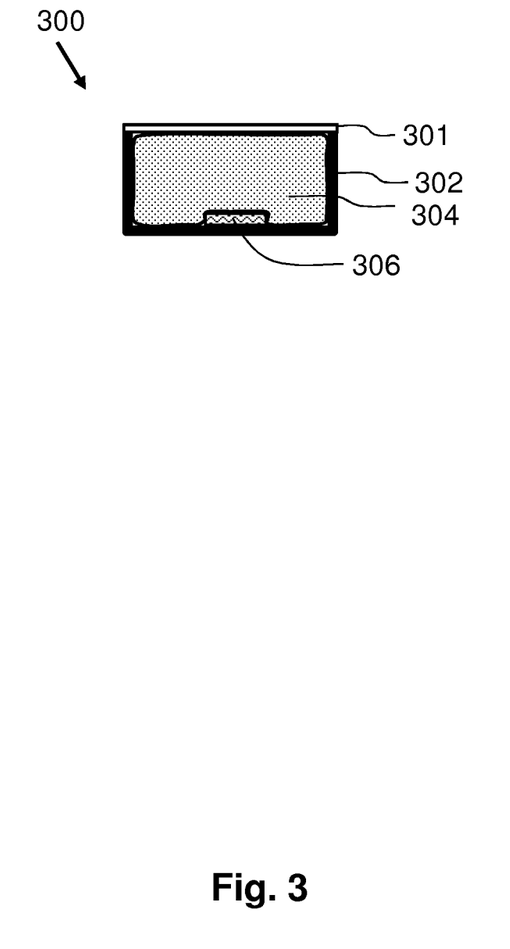

FIG. 3 schematically shows a lighting unit 500 according to the second aspect of the invention. The lighting unit comprises a housing 302 which has a light exit window at which a light transmitting layer 301 is arranged. In an example, the light transmitting layer may be a diffuser. In yet another example, the light transmitting layer is a layer of microcollimators. Inside the housing is arranged a solid state light emitter 306 which is configured to emit light of a first spectrum towards the light exit window of the housing. The interior of the housing 302 is filled with the silicone product 304 according to the first aspect of the invention. The silicone product 304 is provided within the housing to provide a better outcoupling of light from the solid state light emitter 306 and to provide an advantageous light guiding of the outcoupled light towards the light exit window. The luminescent particles of the silicone product 304 receive the light of the first spectrum and absorb at least a portion of this light. The luminescent particles convert a portion of the absorbed light towards light of a second spectrum. Depending on the amount of luminescent particles in the silicone product 304, the first spectrum and the second spectrum will be emitted into the ambient in a specific ratio which determines the color of the light emitted by the lighting unit 300. The lighting unit 300 is relatively efficient. The luminescent material in the silicone product 304 provide a high quantum efficiency, and the silicone product 304 assist in the outcoupling of light from the solid state light emitter 306, and, thus, not much light is trapped in the solid state light emitter 306. Examples of solid state light emitters are Light Emitting Diodes (LEDs), Organic Light Emitting diode(s) OLEDs, or, for example, laser diodes. It is to be noted that the invention is not limited to lighting units 300 of which the interior space is fully filled with the silicone product 304. In specific embodiments, the interior space is partially filled with silicone and partially filled with the silicone product according to the first aspect of the invention.

Figure 4:
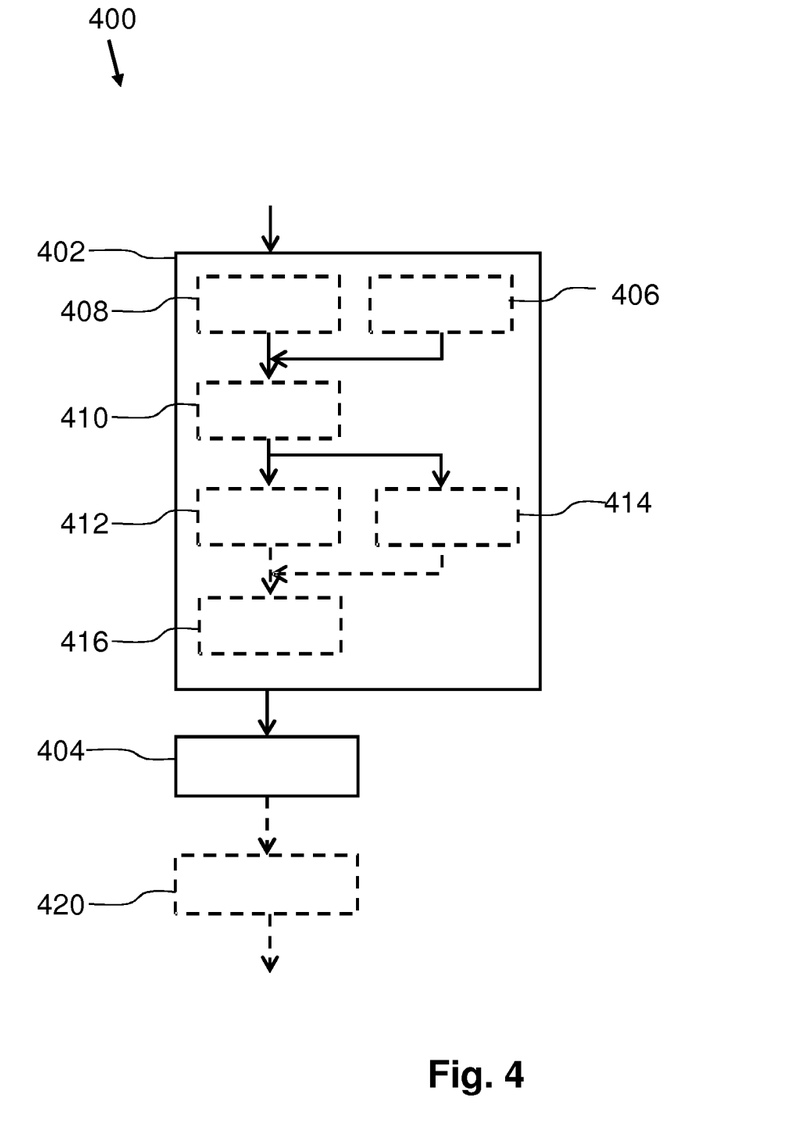

FIG. 4 schematically presents an embodiment of a method 400 of manufacturing a silicone product comprising immobilized luminescent material. In step 402 a mixture of filler particles of a light transmitting inert material and a luminescent material is obtained. The luminescent material comprises particles showing quantum confinement and have at least in one dimension a size in the nanometer range. In the mixture, the particles of the luminescent material are situated at a surface of the filler particles. In a subsequent step 404 the mixture obtained in step 402 is mixed with a polymeric material which comprises a material of the group of polysiloxanes. The luminescent material may also comprise material which has, in at least one dimension, a size in the nanometer range, but does not show quantum confinement. The particles of luminescent material are at the surface of the filler particles and are thus immobilized. This means that, when the mixture is mixed with the polymeric material, the particles of luminescent material do not flocculate or aggregate and remain at the surface of the filler particles and, thus, is the quantum efficiency of the luminescent material not negatively influenced when being applied in the polymeric material.

The step 402 of obtaining the mixture of filler particles and the luminescent material may, optionally, be subdivided in the subsequent steps:

obtaining 406 a first homogeneous mixture of filler particles in a first solvent, obtaining 408 a second homogeneous mixture of filler particles in a second solved, mixing 410 the first homogeneous mixtures with the second homogeneous mixture to obtain a third homogeneous mixture, flocculating 412, 414 the luminescent material on the filler particles by changing 412 a solvent composition of the third homogeneous mixture or changing 414 a solvent quality of the third homogeneous mixture.

In the above discussed steps, the filler particles may be hydrophobized silica particles and the first solvent is often a suitable nonpolar or slightly polar solvent. Examples of suitable material for the first solvent are: toluene, xylene, butyl acetate or hexamethyldisiloxane, or longer alcohols like n-decanol. If the particles of the luminescent material are quantum dots, they are typically diluted from a stock solution into the second solvent to form a stable dispersion. The second solvent may be the same solvent as the first solvent or at least one solvent of a similar type.

Changing 412 the solvent composition of the third homogeneous mixture may be performed by adding a third solvent to the third homogeneous mixture. Solvents which are more polar than the first solvent and second solvent are effective to establish the flocculation. Also some specific other nonpolar can cause the flocculation of the luminescent material on the filler particles. An example of a more polar solvent is propylene carbonate. The boiling point of propylene carbonate is relatively high (240° C.), which is advantageous when the solvents are removed from the mixture by thermal treatment; the first solvent and second solvent will be removed before the third solvent is removed, and, thus, the likelihood that the particles of luminescent material stay on the surface of the filler particles is increased. Optionally, in the step of mixing 404 the obtained mixture of step 402 with a polymeric material comprising a material of the group of polysiloxanes, the third solvent may still be present in the obtained mixture. Often, the polymeric material also comprises a fourth solvent and when the mixture of the polymeric material and the mixtures of luminescent particles at filler particles surfaces is cured, in an advantageous embodiment, the fourth solvent is removed before the third solvent is removed.

Alternatively, the solvent quality of the third homogeneous mixtures may be changed 414 by changing the temperature of the third homogeneous mixture. With suitable solvents, heating or cooling result in the flocculation of quantum dots and thus in flocculating the luminescent material on the filler particles. For example, the luminescent particles are colloidally stable in the subsequent solvents at room temperature, but flocculate at −18° C.: dipropylene glycol dimethylether, iso butyl acetate, methyl isobutyl keton and n-amyl acetate.

Additionally and optionally, the third homogeneous mixture is dried 416. Drying may, for example, be performed by heat treatment and/or by creating a vacuum.

The step of mixing 404 the mixture of filler particles and the luminescent material with the polymeric material may be followed by a step of curing 420 the mixture obtained in step 404.

It is to be noted that, unless otherwise explained, the order of the steps of the method may be different or some steps may be executed in parallel. For example, the steps 406 and 408 of obtaining the first homogeneous mixture and obtaining the second homogeneous mixture may be executed in parallel or in another order.

In a comparative test two samples were manufactured. A first sample was manufactured according to the state of the art methods of manufacturing a silicone product containing luminescent material, and a second sample was manufactured according to the invention.

The first sample was manufactured as follows: 15 µl of a stock solution of quantum dots (10% w/v) was diluted in 1 ml toluene. The diluted solution was added to a 70% silicone (KJR9226) in toluene solution. Layers of the silicone product were prepared by drop-casting. Especially for creating a Transmission Electron Microscopy (TEM) image, a thin layer was prepared by quickly removing excess liquid on the TEM window using capillary forces. The layers were cured, 5 minutes at 50° C., 5 minutes at 100° C. and 30 minutes 15 150° C. It was observed in the TEM image that the quantum dots formed clusters, for example, with a diameter of around 100 nm. Two dimensional and three dimensional clusters were found in the sample. A limited amount of quantum dots were found as single quantum dots.

The second sample was manufactured as follows: 0.1 g of silica (WP-300) was dispersed in 1 ml of 1-decanol (bp=233° C.). 15 µl of a stock solution of quantum dots (10% w/v) was diluted in 1 ml of 1-decanol. These two dispersions were added together. An amount of 0.2 ml propylene carbonate was added which was enough to cause flocculation of the quantum dots. Thereafter the sample was left stirring for 15 minutes. Subsequently, 0.6 ml of silicone resin (KJR9226—50% in phenetole (bp=170° C.)) was added. Layers of the silicone product were prepared by drop-casting. Especially for creating a Transmission Electron Microscopy (TEM) image, a thin layer was prepared by quickly removing excess liquid on the TEM window using capillary forces. The layers were cured, 5 minutes at 50° C., 5 minutes at 100° C. and 30 minutes 15 150° C. It was observed in the TEM image that hardly any free quantum dots were present and that the quantum dots are attached to the silica particles. Most of the quantum dots were spaced at some distance from other quantum dots—only a minor number of quantum dots formed small clusters of quantum dots at the surface of the silica particles.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the product claim enumerating several means, several of these means may be embodied by one and the same feature. The mere fact that certain measures are recited in mutually different dependent claims does not indicate that a combination of these measures cannot be used to advantage.

The invention claimed is:

1. A composition comprising:
   a polymeric material comprising a material of the group of polysiloxanes, wherein the polymeric material is light transmitting,
   a luminescent material comprising luminescent particles, the luminescent particles having at least in one dimension a size in the nanometer range, the luminescent material being configured to absorb light of a first spectral range and to convert a portion of the absorbed light into light of a second spectral range, and filler particles of a light transmitting inert material, the filler particle are miscible with the luminescent material, the filler particles are provided in the polymeric material, wherein the luminescent particles are distributed along a surface of the filler particles.

2. The composition according to claim 1, wherein the filler particles are larger than the luminescent particles.

3. The composition according to claim 1, wherein the luminescent material comprises at least one of quantum dots, quantum rods and quantum tetrapods.

4. The composition according to claim 1, wherein at least 60% of the luminescent particles are separated far enough from other luminescent particles to prevent a reduction of quantum efficiency of these particles.

5. The composition according to claim 1, wherein the filler particles are a material selected from the group comprising alumina, titania, silica or clay.

6. The composition according to claim 1, wherein a surface of the luminescent particles comprises a first layer of organic material.

7. The composition according to claim 1, wherein the surface of the filler particles comprises a layer of organic material.

8. The composition according to claim 6, wherein the surface of the filler particles comprises a second layer of organic material and at least one of the first layer and the second layer of organic material is a monolayer.

9. The composition according to claim 1, wherein not more than 10% of the surface of the filler particles is covered by the luminescent particles.

10. The composition according to claim 1, wherein the relative amount of luminescent material is at least 0.05 weight percent of the silicone product and the relative amount of the luminescent material is not more than 10 weight percent of the silicone product.

11. The composition according to claim 1, wherein the relative amount of the filler particles is not more than 40 weight percent of the silicone product, and the relative amount of the filler particles is at least twice the relative amount of luminescent material expressed as a weight percentage of the silicone product.

12. The composition according to claim 1, wherein the silicone product is a resin and the polymeric material is a silicone resin.

13. A device comprising:
a light source, and
a composition arranged to receive light from the light source, the composition comprising:
a polymeric material comprising a material of the group of polysiloxanes, wherein the polymeric material is light transmitting,
a luminescent material comprising luminescent particles, the luminescent particles having at least in one dimension a size in the nanometer range, the luminescent material being configured to absorb light of a first spectral range and to convert a portion of the absorbed light into light of a second spectral range, and
filler particles of a light transmitting inert material, the filler particle are miscible with the luminescent material, the filler particles are provided in the polymeric material,
wherein the luminescent particles are distributed along a surface of the filler particles.

14. The composition according to claim 1, wherein the luminescent particles distrusted on the surface of the filler particles are immobilized in the polymeric material.

15. The composition according to claim 14, wherein the polymeric material is cured.

* * * * *